United States Patent
Ito et al.

(10) Patent No.: US 8,455,911 B2
(45) Date of Patent: Jun. 4, 2013

(54) SEMICONDUCTOR LIGHT-EMITTING DEVICE

(75) Inventors: Toshihide Ito, Tokyo (JP); Koichi Tachibana, Kanagawa (JP); Shinya Nunoue, Chiba (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 295 days.

(21) Appl. No.: 12/873,586

(22) Filed: Sep. 1, 2010

(65) Prior Publication Data

US 2011/0215291 A1 Sep. 8, 2011

(30) Foreign Application Priority Data

Mar. 8, 2010 (JP) ................... 2010-050673

(51) Int. Cl.
*H01L 33/00* (2010.01)

(52) U.S. Cl.
USPC 257/99; 257/745; 257/E33.034; 257/E33.064

(58) Field of Classification Search
USPC ............... 257/99, 745, E33.034, E33.064
See application file for complete search history.

(56) References Cited

U.S. PATENT DOCUMENTS

| | | | |
|---|---|---|---|
| 6,495,852 | B1 | 12/2002 | Mouri |
| 7,910,935 | B2 | 3/2011 | Seong |
| 2008/0258174 | A1 | 10/2008 | Seong |
| 2008/0303055 | A1 | 12/2008 | Seong |

FOREIGN PATENT DOCUMENTS

| | | |
|---|---|---|
| CN | 101351898 | 1/2009 |
| JP | 2004-172649 | 6/2004 |
| JP | 2009-519608 | 5/2009 |
| KR | 10-2007-0063912 | 6/2007 |
| WO | WO 2007/074969 A1 | 7/2007 |

OTHER PUBLICATIONS

Office Action issued Oct. 28, 2011, in Korean Patent Application No. 10-2010-0085924 (with English-language translation).
Office Action issued May 31, 2012 in Korean Patent Application No. 10-2010-0085924 (with English translation).
Marcel Himmerlich, et al., "Effect of Annealing on the Properties of Indium-Tin-Oxynitride Films as Ohmic Contacts for GaN-Based Optoelectronic Devices", ACS Applied Materials & Interfaces, 2009, vol. 1, No. 7, pp. 1451-1456.
U.S. Appl. No. 13/218,728, filed Aug. 26, 2011, Ito, et al.
Office Action issued Feb. 20, 2013, in Chinese Patent Application No. 2010102752936 (with English-language Translation).

*Primary Examiner* — Minh-Loan T Tran
(74) *Attorney, Agent, or Firm* — Oblon, Spivak, McClelland, Maier & Neustadt, L.L.P.

(57) ABSTRACT

According to one embodiment, a semiconductor light-emitting device using an ITON layer for a transparent conductor and realizing low drive voltage, high luminance efficiency, and uniformed light emission intensity distribution is provided. The semiconductor light-emitting device includes: a substrate; an n-type semiconductor layer formed on the substrate; an active layer formed on the n-type semiconductor layer; a p-type semiconductor layer formed on the active layer and whose uppermost part is a p-type GaN layer; an ITON (Indium Tin Oxynitride) layer formed on the p-type GaN layer; an ITO (Indium Tin Oxide) layer formed on the ITON layer; a first metal electrode formed on a part on the ITO layer; and a second metal electrode formed in contact with the n-type semiconductor layer.

14 Claims, 4 Drawing Sheets

SEMICONDUCTOR LIGHT-EMITTING DEVICE

CROSS-REFERENCE TO RELATED APPLICATION

This application is based upon and claims the benefit of priority from Japanese Patent Application No. 2010-050673, filed on Mar. 8, 2010, the entire contents of which are incorporated herein by reference.

FIELD

Embodiments described herein relate generally to a semiconductor light-emitting device.

BACKGROUND

In recent years, research and development on light emitting diodes (LEDs) of blue and green made of GaN-based semiconductor are being promoted. In an LED of an FU (Face Up) type, an oxide transparent conductor such as ITO (Indium Tin Oxide) is generally used as a transparent conductor on a p-type GaN layer.

To make the drive voltage of the LED low, it is necessary to decrease contact resistance between ITO and the p-type GaN layer. However, the Schottky barrier height between ITO and the p-type GaN layer is high as 3.2 eV, and it is difficult to decrease the contact resistance.

There is proposed a technique of reducing the Schottky barrier height by using ITON (Indium Tin Oxynitride) obtained by adding nitrogen thereto and forming ohmic contact. A technique of stacking an oxide transparent conductor and an oxynitride transparent conductor on the p-type GaN layer is also proposed.

DETAILED DESCRIPTION

Figure 1A:
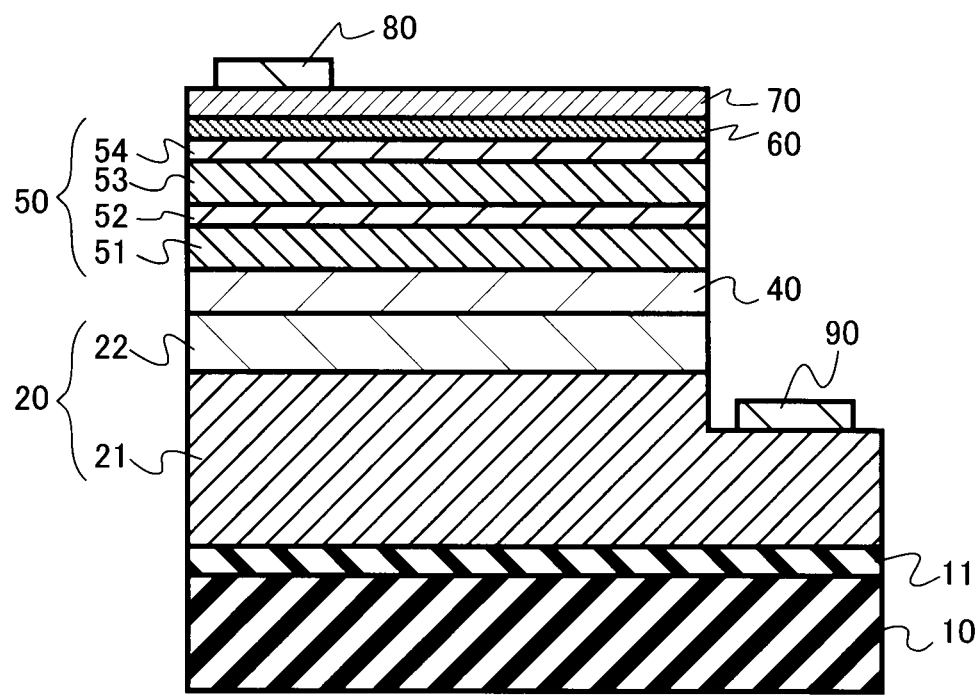
FIGS. 1A and 1B are schematic cross section diagrams of a semiconductor light-emitting device of a first embodiment.

According to one embodiment, a semiconductor light-emitting device using an ITON layer for a transparent conductor and realizing low drive voltage, high luminance efficiency, and uniformed light emission intensity distribution is provided. The semiconductor light-emitting device includes: a substrate; an n-type semiconductor layer formed on the substrate; an active layer formed on the n-type semiconductor layer; a p-type semiconductor layer formed on the active layer and whose uppermost part is a p-type GaN layer; an ITON (Indium Tin Oxynitride) layer formed on the p-type GaN layer; an ITO (Indium Tin Oxide) layer formed on the ITON layer; a first metal electrode formed on a part on the ITO layer; and a second metal electrode formed in contact with the n-type semiconductor layer. Embodiments will be described below with reference to the drawings. In the following description of the drawings, the same or likewise reference numerals are designated to the same or likewise components.

First Embodiment

A semiconductor light-emitting device of a first embodiment has a substrate, an n-type semiconductor layer formed on the substrate, an active layer formed on the n-type semiconductor layer, a p-type semiconductor layer formed on the active layer and whose uppermost part is a p-type GaN layer, i.e. the p-type GaN layer formed above the active layer, an ITON (Indium Tin Oxynitride) layer formed on the p-type GaN layer, an ITO (Indium Tin Oxide) layer formed on the ITON layer, a first metal electrode formed on a part on the ITO layer, and a second metal electrode formed in contact with the n-type semiconductor layer.

In the semiconductor light-emitting device of the embodiment, as the transparent conductor on the p-type GaN layer, the stack structure of the ITON layer and the ITO layer is used, thereby reducing the interface resistance between the p-type GaN layer and the transparent conductor and reducing the sheet resistance of the transparent conductor. Therefore, the semiconductor light-emitting device with low drive voltage, high luminance efficiency, and uniformed light emission intensity distribution can be realized.

Figure 1B:
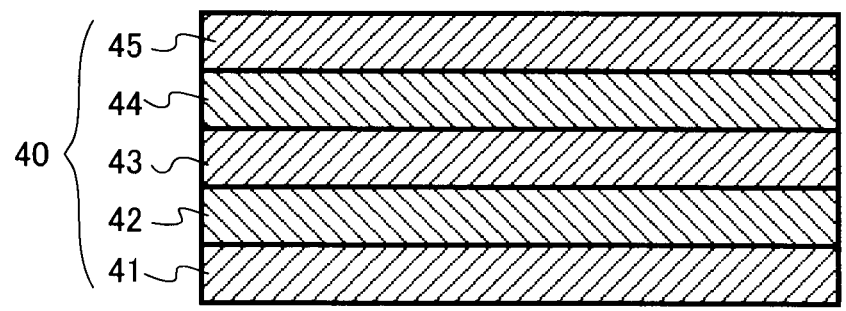

FIGS. 1A and 1B are schematic cross section diagrams of the semiconductor light-emitting device of the embodiment. FIG. 1A shows the general configuration, and FIG. 1B shows the configuration of the active layer. The semiconductor light-emitting device of the embodiment is a light emitting diode of the FU type.

As shown in FIG. 1A, in the semiconductor light-emitting device of the embodiment, for example, a buffer layer 11 is formed on the main surface of a substrate 10 made of sapphire and, on the buffer layer 11, an n-type GaN layer 21 and an n-type GaN guide layer 22 are formed. The n-type GaN layer 21 and the n-type GaN guide layer 22 are included in an n-type semiconductor layer 20.

An active layer 40 as a light emitting part is formed on the n-type GaN guide layer 22. On the active layer 40, a p-type GaN first guide layer 51, a p-type AlGaN layer 52 as an electron overflow preventing layer, a p-type GaN second guide layer 53, and a p-type GaN contact layer 54 are formed in this order. The p-type GaN first guide layer 51, the p-type AlGaN layer 52, the p-type GaN second guide layer 53, and a p-type GaN contact layer 54 are included in a p-type semiconductor layer 50.

Further, on the p-type GaN layer as the uppermost part of the p-type semiconductor layer 50, an ITON (Indium Tin Oxynitride) layer 60 and an ITO (Indium Tin Oxide) layer 70 are formed in this order. A p-type electrode 80 as a first metal electrode is formed on a part of the ITO (Indium Tin Oxide) layer 70. The p-type electrode 80 is, for example, a composite film of palladium-platinum-gold (Pd/Pt/Au).

A part of the n-type GaN layer 21, the active layer 40, the p-type semiconductor layer 50, the ITON (Indium Tin Oxynitride) layer 60, and the ITO (Indium Tin Oxide) layer 70 are removed, and an n-type electrode 90 is formed as a second metal electrode. Specifically, the n-type electrode 90 is connected to the n-type semiconductor layer 20. The n-type electrode 90 is, for example, a composite film of nickel and gold (Ni/Au).

The active layer 40 as a light emitting part has, for example, as shown in FIG. 1B, a stack structure, as a one set, of a barrier layer 41, an intermediate layer 42, a quantum well layer 43, an intermediate layer 44, and a barrier layer 45. As an example, a plurality of sets of the stack structures are provided. A stack structure of repeatedly providing the barrier layer 41 (45) and the quantum well layer 43 may be employed without providing the intermediate layers 42 and 44.

The barrier layer 41 is formed of InAlGaN (generally expressed as $In_xAl_yGa_{1-x-y}N$ (0<x<1, 0<y<1)) and is made of, for example, $In_{0.02}Al_{0.33}Ga_{0.65}N$ having a thickness of 12.5 nm. The intermediate layer 42 is formed of InGaN (generally expressed as $In_xGa_{1-x}N$ (0<x<1)) and is made of, for example, $In_{0.02}Ga_{0.98}N$ having a thickness of 0.5 nm. The quantum well layer 43 is formed of InGaN (generally expressed as $In_xGa_{1-x}N$ (0<x<1)) and is made of, for example, $In_{0.15}Ga_{0.85}N$ having a thickness of 2.5 nm. The intermediate layer 44 is formed of InGaN (generally expressed as $In_xGa_{1-x}N$ (0<x<1)) and is made of, for example, $In_{0.02}Ga_{0.98}N$ having a thickness of 0.5 nm. The barrier layer 45 is formed of InAlGaN (generally expressed as $In_xAl_yGa_{1-x-y}N$ (0<x<1, 0<y<1) and is made of, for example, $In_{0.02}Al_{0.03}Ga_{0.65}N$ having a thickness of 11.5 nm.

The semiconductor light-emitting device of the embodiment is manufactured up to the p-type semiconductor layer 50 by using a known manufacturing method. After formation of the p-type GaN layer 54 in the uppermost part of the p-type semiconductor layer 50, for example, the ITON layer 60 is formed by reactive sputtering in nitrogen atmosphere. Subsequently, the ITO layer 70 is formed by reactive sputtering in oxygen atmosphere.

After that, the p-type electrode 80 and the n-type electrode 90 are formed by a known method, thereby forming the semiconductor light-emitting device shown in FIG. 1. In the semiconductor light-emitting device shown in FIG. 1, by applying voltage across the p-type electrode 80 and the n-type electrode 90, current flows in the device and light is generated in the active layer 40.

The ITON layer 60 can be also formed by once depositing ITO by reactive sputtering in the oxygen atmosphere in place of reactive sputtering in the nitrogen atmosphere and, after that, nitriding ITO by performing annealing in ammonia ($NH_3$) atmosphere. In this case, it is sufficient to form the ITO layer 70 after the annealing.

It was clarified by the examination of the inventors of the present invention that when the transparent conductor between the p-type GaN layer 54 and the p-type electrode 80 is formed only by a single ITON layer, the current components flowing in the horizontal direction (the direction from the left side to the right side in FIGS. 1A and 1B) in the ITON layer decrease and, as a result, current is concentrated around the p-type electrode 80. Consequently, a problem occurs such that light is emitted concentratedly just below the p-type electrode. It is caused by the fact that the volume resistivity of ITON is higher than that of ITO by two digits.

In the semiconductor light-emitting device of the embodiment, the contact resistance between the p-type GaN layer 54 and the transparent conductor is decreased by the ITON layer 60. Therefore, the drive voltage (Vf) of the semiconductor light-emitting device is decreased, so that lower drive voltage and higher luminance efficiency is realized.

By stacking the ITO layer 70, the sheet resistance of the transparent conductor is reduced, and the ratio of the current components flowing in the parallel direction in the transparent conductor of current is increased. As a result, uniform light emission in the light emitting part is realized, and a uniform light emission intensity distribution is also realized.

For example, in the case where the semiconductor light-emitting device is a blue light emitting diode, to maintain high luminance efficiency, the transparent conductor between the p-type GaN layer 54 and the p-type electrode 80 has to transmit blue light having a wavelength of 450 nm emitted from the active layer 40.

The upper end of the valence band of ITON is composed of the nonbonding states of nitrogen. As the nitrogen content of ITON increases, the energy level at the upper end of the valence band rises, and the band gap of ITON becomes narrower.

As a result, the absorption onset of ITON is desirably 2.8 eV or higher so as not to absorb blue light. At the nitrogen concentration of ITON at which the absorption end energy is 2.8 eV, the Schottky barrier height between the p-type GaN layer 54 and the ITON layer 60 is about 2.0 eV. Therefore, in the embodiment, the Schottky barrier height between the p-type GaN layer 54 and the ITON layer 60 is desirably 2.0 eV or higher.

Since the Schottky barrier height between the p-type GaN and ITO is 3.2 eV, the Schottky barrier height between the p-type GaN layer 54 and the ITON layer 60 naturally becomes 3.2 eV or less.

For the blue light having the wavelength of 450 nm, the refractive index of the ITON layer 60 is desirably 2.11 to 2.34. The refractive index of the p-type GaN is about 2.48. The refractive index of ITO is 1.8 to 2.2.

The light generated in the active layer 40 is partly reflected by two interfaces; the interface between the p-type GaN layer 54 and the ITON layer 60, and the interface between the ITON layer 60 and the ITO layer 70. To improve the luminous efficiency of the semiconductor light-emitting device, it is necessary to reduce light which is reflected by the two interfaces and does not go to the outside.

When the refractive index of the p-type GaN layer 54 is $n_{pGaN}$ and the refractive index of the ITON layer 60 is $n_{ITON}$, the normal incidence reflectivity $R_1$ in the interface when light is incident perpendicular to the interface between the p-type GaN layer 54 and the ITON layer 60 is expressed as follows.

$$R_1 = (n_{pGaN} - n_{ITON})^2 / (n_{pGaN} + n_{ITON})^2 \qquad \text{Equation 1}$$

Since the difference in the extinction coefficient between the p-type GaN layer 54 and the ITON layer 60 is sufficiently smaller as compared with the refractive index difference, it is ignored.

Similarly, when the refractive index of the ITO layer 70 is $n_{ITO}$, reflectance $R_2$ of the interface between the ITON layer 60 and the ITO layer 70 is expressed as follows.

$$R_2 = (n_{ITON} - n_{ITO})^2 / (n_{ITON} + n_{ITO})^2 \qquad \text{Equation 2}$$

Therefore, to minimize $R_1$ and $R_2$ and minimize light which is lost by being reflected by two interfaces, $n_{ITON}$ is desirably the geometric mean of $n_{pGaN}$ and $n_{ITO}$, that is, $$n_{ITON} = \sqrt{n_{pGaN} n_{ITO}} \qquad \text{Equation 3}$$

As described above, for blue light having the wavelength of 450 nm, the refractive index $n_{pGaN}$ of the p-type GaN is about 2.48 and the refractive index $n_{ITO}$ of ITO is 1.8 to 2.2. Therefore, the refractive index $n_{ITON}$ of the ITON layer is desirably 2.11 to 2.34. The refractive index of the ITON layer can be set to a desired value by setting the nitrogen concentration to a proper value.

The thickness of the ITO layer 70 is desirably 130 nm to 170 nm. When the ITO layer 70 is thinner than 130 nm, the sheet resistance is too high and there is the possibility that light is generated concentratedly around the p-type electrode 80. When the thickness exceeds 170 nm, there is the possibility that the absorption amount of light in the ITO layer 70 becomes unignorable.

In the case where the thickness of the ITO layer 70 is 130 nm to 170 nm, the total thickness of the ITON layer 60 and the ITO layer 70 is desirably 240 nm to 310 nm.

Figure 2:
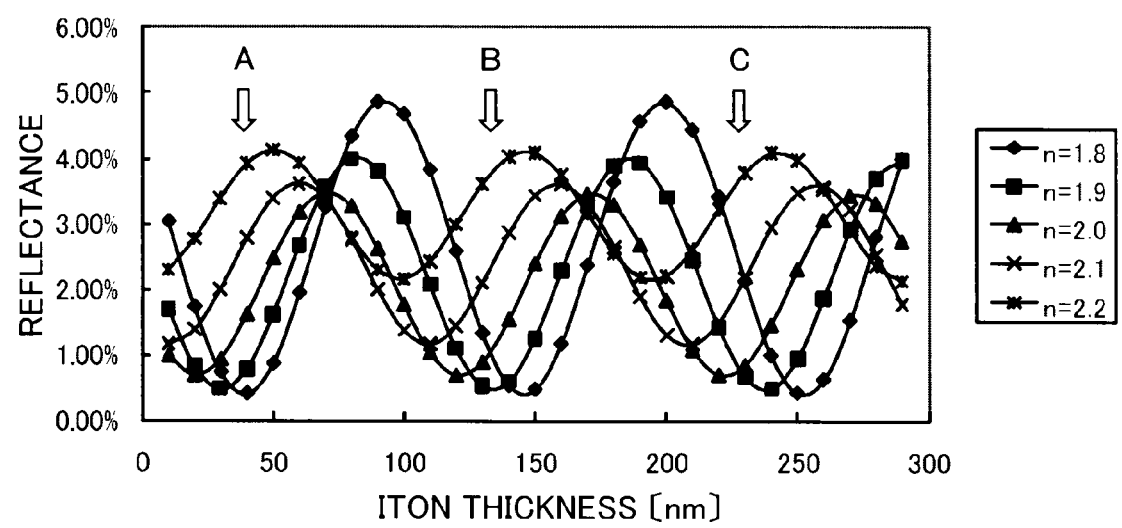
FIG. 2 is a diagram showing ITON layer thickness dependency of reflectance of the semiconductor light-emitting device of the first embodiment.
Figure 3:
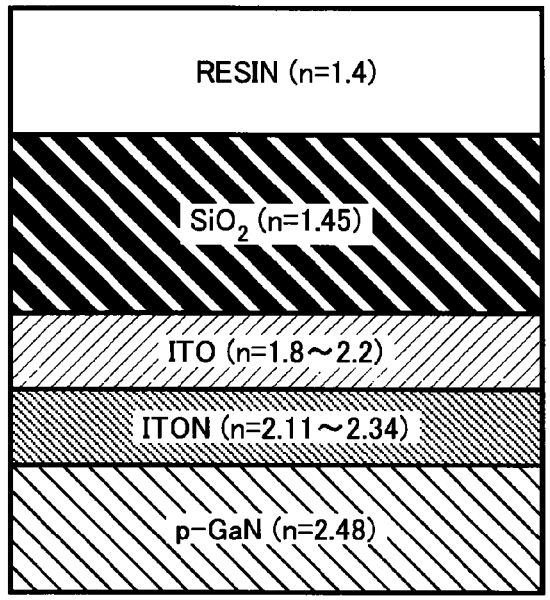
FIG. 3 is a schematic cross section diagram of a device structure used for simulation of FIG. 2.

FIG. 2 is a diagram showing ITON layer thickness dependency of reflectance of the semiconductor light emitting device of the embodiment. It shows the result of simulation. FIG. 3 is a schematic cross section diagram of a device structure used for the simulation of FIG. 2. The ITON layer thickness dependency of reflectance was calculated with respect to the cases where the refractive index of ITO is 1.8, 1.9, 2.0, 2.1, and 2.2.

As shown in FIG. 3, as the device structure, a stack structure of a p-type GaN layer, an ITON layer, an ITO layer, an SiO layer (refractive index n=1.45), and a resin layer (refractive index n=1.4) is employed. The wavelength of light is 450 nm. The thickness of the ITO layer is 150 nm. The refractive index of the ITON layer is the geometric mean of the refractive indices of the p-type GaN layer and the ITO layer.

It was found that, as shown in FIG. 2, when the thickness of the ITON film is in the range of 0 to 300 nm, at all of the refractive indices, there are three portions A, B, and C in thickness in which the reflectance is low as in the valley. The portion A in the thickness is undesirable for the following reasons. The ITON film is too thin and the possibility that it is optically inactive is high. In addition, it is difficult to control the thickness in manufacture. The portion C in thickness is unpreferable for a reason that the thickness is too large and absorption of light in the ITON layer increases. Therefore, it is desirable to set the thickness of the ITON layer to the thickness in the portion B.

Even the thickness of the $SiO_2$ layer was changed in the range of 100 nm to 500 nm, no large change occurs in the result shown in FIG. 2.

Figure 4:
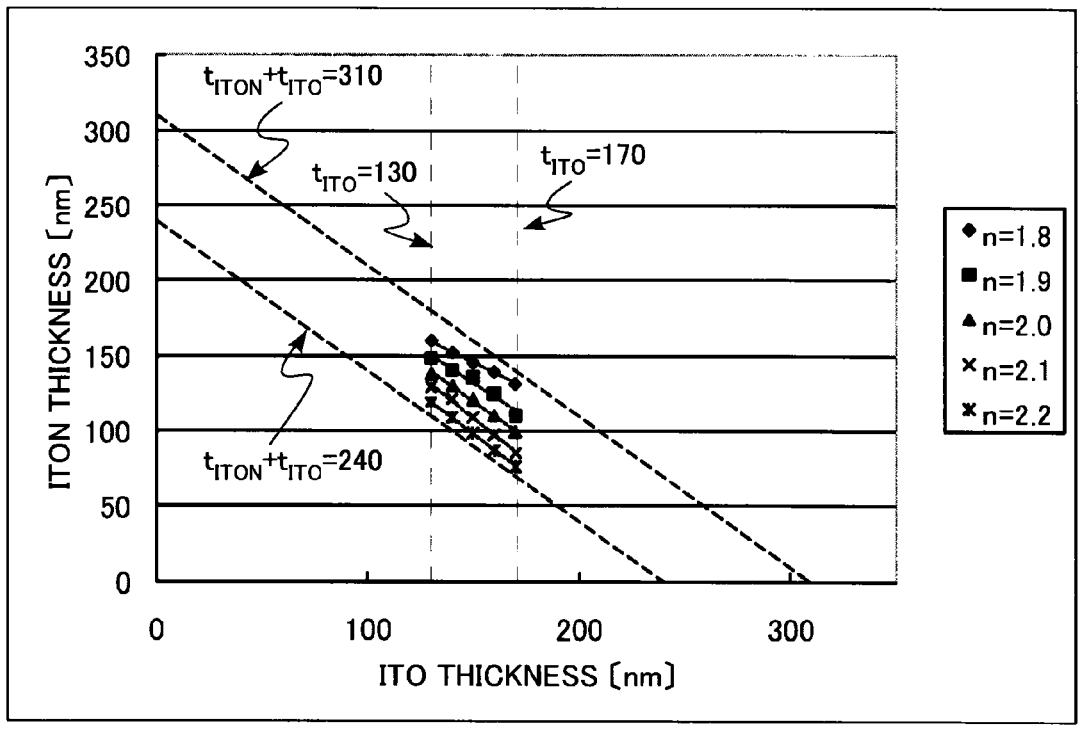
FIG. 4 is a diagram showing ITO layer thickness dependency of optimum thickness of the ITON layer of the first embodiment.

FIG. 4 is a diagram showing ITO layer thickness dependency of optimum thickness of the ITON layer. The diagram is obtained by plotting the thickness of the ITON layer in the portion B in the case where the thickness of the ITO layer is changed in the range of 130 nm to 170 nm. Calculation was made in each of the cases where the refractive index of ITO is 1.8, 1.9, 2.0, 2.1, and 2.2.

As obvious from FIG. 4, at any of the refractive indices, the optimum thickness on the ITO layer of the ITON layer is on a straight line having a tilt of almost 1. Therefore, under the condition that the reflectance is the lowest, the sum of the thickness ($t_{ITO}$ in the diagram) of the ITO layer and the thickness ($t_{ITON}$ in the diagram) of the ITON layer is almost constant. The constant value is in the range of 240 nm to 310 nm even when the refractive index of ITO changes.

Therefore, from the viewpoint of suppressing reflectance and realizing high luminous efficiency, it is desirable that the thickness of the ITO layer is 130 nm to 170 nm, and the total thickness of the ITON layer and the ITO layer is 240 nm to 310 nm. Although description has been given on the basis of the simulation result of the case where the wavelength is 450 nm, changes in the refractive index accompanying changes in the wavelength are small as long as the wavelength is in the range of 420 nm to 480 nm, so that the desired range of the total thickness of the ITON layer and the ITO layer becomes accordingly.

It is also desirable that nitrogen concentration in the ITON layer 60 decreases with distance from interface with the p-type GaN layer 54 toward the interface with the ITO layer 70. When the nitrogen concentration in the ITON layer 60 is high, the Schottky barrier between the p-type GaN layer 54 and the ITON layer 60 is lowered. On the other hand, when the nitrogen concentration in the ITON layer 60 decreases, the refractive index decreases. Consequently, by controlling the concentration distribution so that the nitrogen concentration becomes zero in the interface with the ITO layer 70, the reflectance of light in the interface with the ITO layer 70 can be made zero.

Second Embodiment

A semiconductor light-emitting device of a second embodiment is similar to that of the first embodiment except that the patterns of the p-type electrode and the n-type electrode are different. Therefore, description similar to that of the first embodiment will be omitted.

Figure 5A:
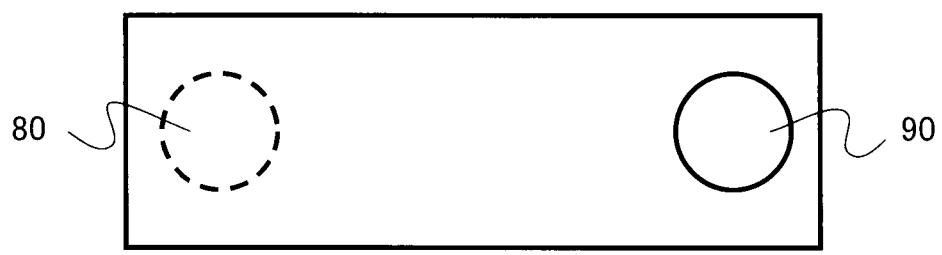
FIGS. 5A and 5B are plan views showing patterns of electrodes of a second embodiment.
Figure 5B:
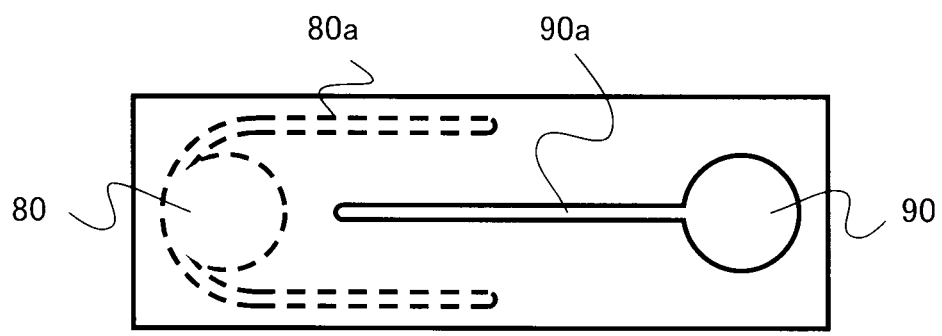

FIGS. 5A and 5B are plan views showing electrode patterns of the second embodiment. FIG. 5A shows the electrode pattern of the first embodiment, and FIG. 5B shows the electrode pattern of the second embodiment.

As shown in FIG. 5B, the p-type electrode 80 and the n-type electrode 90 are provided with thin wires 80a and 90a, respectively. By providing the thin wires 80a and 90a in such a manner, the flow to the active layer 40, of current between the p-type electrode 80 and the n-type electrode 90 is made more uniform, and the light emission intensity distribution can be made more uniform.

Therefore, the semiconductor light-emitting device realizing higher luminous efficiency and more uniform light emission intensity distribution as compared with the semiconductor light-emitting device of the first embodiment is realized.

While certain embodiments have been described, these embodiments have been presented by way of example only, and are not intended to limit the scope of the inventions. Indeed, the semiconductor light emitting device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A device comprising:
   a substrate:
   an n-type semiconductor layer formed on the substrate;
   an active layer formed on the n-type semiconductor layer;
   a p-type GaN layer formed above the active layer;
   an ITON (Indium Tin Oxynitride) layer formed on the p-type GaN layer;
   an ITO (Indium Tin Oxide) layer formed on the ITON layer;
   a first metal electrode formed on a part on the ITO layer; and
   a second metal electrode formed in contact with the n-type semiconductor layer,
   wherein a thickness of the ITO layer is 130 nm to 170 nm, and
   a total thickness of the ITON layer and the ITO layer is 240 nm to 310 nm.

2. The device according to claim 1, wherein a Schottky barrier height between the p-type GaN layer and the ITON layer is 2.0 eV to 3.2 eV.

3. The device according to claim 1, wherein a refractive index of the ITON layer is 2.11 to 2.34.

4. The device according to claim 1, wherein nitrogen concentration in the ITON layer decreases with distance from an interface with the p-type GaN layer toward an interface with the ITO layer.

5. The device according to claim 1, wherein the substrate is a sapphire substrate.

6. The device according to claim 1, wherein the n-type semiconductor layer has an n-type GaN layer.

7. The device according to claim 1, wherein the active layer has a stack structure of a barrier layer of InAlGaN and a quantum well layer of InGaN.

8. A device comprising:
- an n-type semiconductor layer;
- an active layer formed on the n-type semiconductor layer;
- a p-type GaN layer formed above the active layer;
- an ITON (Indium Tin Oxynitride) layer formed on the p-type GaN layer;
- an ITO (Indium Tin Oxide) layer formed on the ITON layer;
- a first metal electrode formed on a part on the ITO layer; and
- a second metal electrode formed in contact with the n-type semiconductor layer,
- wherein a thickness of the ITO layer is 130 nm to 170 nm, and a total thickness of the ITON layer and the ITO layer is 240 nm to 310 nm.

9. The device according to claim 8, wherein a Schottky barrier height between the p-type GaN layer and the ITON layer is 2.0 eV to 3.2 eV.

10. The device according to claim 8, wherein a refractive index of the ITON layer is 2.11 to 2.34.

11. The device according to claim 8, wherein nitrogen concentration in the ITON layer decreases with distance from an interface with the p-type GaN layer toward an interface with the ITO layer.

12. The device according to claim 8, wherein the n-type semiconductor layer is formed on a sapphire substrate.

13. The device according to claim 8, wherein the n-type semiconductor layer has an n-type GaN layer.

14. The device according to claim 8, wherein the active layer has a stack structure of a barrier layer of InAlGaN and a quantum well layer of InGaN.

* * * * *